United States Patent [19]

Shen et al.

[11] Patent Number: 5,708,398
[45] Date of Patent: Jan. 13, 1998

[54] DUAL VOLTAGE CONTROLLED OSCILLATOR USING INTEGRATED TRANSISTOR AND NEGATIVE DIFFERENTIAL RESISTANCE DIODE

[75] Inventors: Jun Shen, Phoenix; Vijay K. Nair, Mesa, both of Ariz.

[73] Assignee: Motorola, Schaumburg, Ill.

[21] Appl. No.: 673,879

[22] Filed: Jul. 1, 1996

[51] Int. Cl.[6] .................................... H03B 7/14
[52] U.S. Cl. ............. 331/115; 331/108 C; 331/117 FE; 331/117 D; 331/177 R
[58] Field of Search ....................... 331/115, 117 R, 331/117 FE, 107 G, 107 T, 177 R, 108 C, 108 D, 117 D

[56] References Cited

U.S. PATENT DOCUMENTS 4,219,829  8/1980  Dorda et al. ............... 331/115
5,039,958  8/1991  Delhaye et al. .............. 331/117 FE

*Primary Examiner*—Siegfried H. Grimm
*Attorney, Agent, or Firm*—Eugene A. Parsons

[57] ABSTRACT

A dual voltage controlled oscillator including a transistor with a negative differential resistance diode coupled to a first terminal and an inductance coupled to a second terminal. Operating voltages are applied to the gate and drain of the transistor to set the oscillator to operating in a negative differential resistance region of the diode. The diode, the inductance and the operating voltages are connected so that varying either of the operating voltages varies the frequency of the oscillations at the output.

14 Claims, 3 Drawing Sheets

5,708,398

DUAL VOLTAGE CONTROLLED OSCILLATOR USING INTEGRATED TRANSISTOR AND NEGATIVE DIFFERENTIAL RESISTANCE DIODE

FIELD OF THE INVENTION

The present invention pertains to voltage controlled oscillators and more specifically to oscillators constructed to be controlled by multiple voltages.

BACKGROUND OF THE INVENTION

In the prior art, voltage controlled oscillators generally require a large number of components to form the various parts required for oscillation and control. For example, generally inductors and capacitors are required to form a tank, or resonant, circuit and additional components are required to change the resonant frequency. At least one of these components must change with the application of a voltage so that the resonant frequency can be varied. Specifically, in a varactor oscillator, the varactor operates like a capacitor (provides capacitance) which varies in accordance with the voltage applied across the varactor. In other oscillators resonance is provided by tuned magnetic circuits but many components are still required to provide the voltage control.

Thus, it would be highly desirable to provide a voltage controlled oscillator with few components and which could be easily integrated onto a single substrate.

Accordingly, it is a purpose of the present invention to provide a new and improved oscillator capable of being controlled by multiple voltages.

It is another purpose of the present invention to provide a new and improved oscillator capable of being controlled by multiple voltages which is simple to fabricate and which includes a minimum of components.

It is still another purpose of the present invention to provide a new and improved oscillator capable of being controlled by multiple voltages which can be fabricated on a single substrate.

It is a further purpose of the present invention to provide a new and improved dual voltage controlled oscillator which includes a transistor with a negative differential resistance diode integrated into a single device.

SUMMARY OF THE INVENTION

The above problems and others are at least partially solved and the above purposes are realized in a dual voltage controlled oscillator including a three terminal transistor with a negative differential resistance diode coupled to a first terminal of the three terminal transistor and an inductance coupled to a second terminal of the three terminal transistor. Two of the three terminals of the transistor have applied thereto operating voltages which set the oscillator to operating in a negative differential resistance region of the diode so that oscillations of a selected frequency are produced at an output terminal. The transistor, the negative differential resistance diode, the inductance and the operating voltages are connected so that varying either or both of the operating voltages varies the frequency of the oscillations at the output.

In specific embodiments, a very simplified dual voltage controlled oscillator can be fabricated by integrating the negative differential resistance device with the transistor, as an extension of the source. A different embodiment of a dual voltage controlled oscillator, which has a higher frequency capability, can be fabricated by connecting the negative differential resistance device to the gate terminal of the transistor and supplying operating voltages to both the gate and drain through two inductances. In either of these embodiments, varying either or both of the operating voltages varies the frequency of the oscillations at the output.

BRIEF DESCRIPTION OF THE DRAWINGS

Referring to the drawings:

FIG. 5 is a graphical representation of the frequency dependence of the device of FIG. 2 on the applied operating voltages;

DESCRIPTION OF THE PREFERRED EMBODIMENTS

Figure 1:
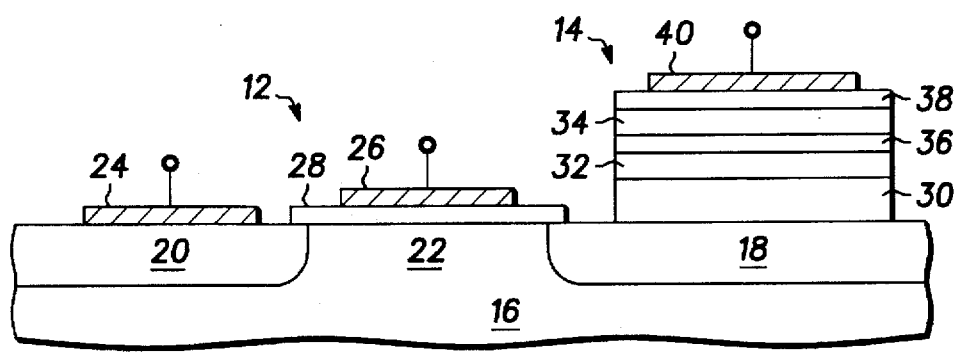
FIG. 1 is simplified sectional view of an integrated negative differential resistance diode and a transistor.

Turning now to the drawings, in which like reference characters indicate corresponding elements throughout the several views, attention is first directed to FIG. 1 which illustrates a resonant tunneling field-effect transistor generally designated by the reference character 10. Resonant tunneling field-effect transistor 10 includes a field-effect transistor 12 formed of a silicon based material system and a resonant tunneling device 14. In this specific embodiment, field-effect transistor 12 is a conventional metal-oxide-semiconductor field-effect transistor (MOSFET) having a silicon substrate 16 in which a source 18 and drain 20 are formed. Source 18 and drain 20 are formed by the addition of dopant material to specific areas of substrate 16 using conventional technology such as diffusion or implantation, etc. and are separated by a channel region 22. In this example, source 18 and drain 20 are a n+ type conductivity while substrate 16, and specifically channel region 22 is a p type conductivity. A drain electrode 24 is formed on drain 20 and a gate electrode 26 is formed over channel region 22 and separated therefrom by a silicon dioxide layer 28. While this specific embodiment illustrates transistor 10 as including a field effect transistor, it will be understood by those skilled in the art that many other types of transistors can be utilized and that the field effect transistor is only being used for purposes of this description.

It will of course be understood by those skilled in the art that silicon based FET 12 is illustrated for example and other FETs (as well as other types of transistors), such as Gallium Arsenide based structures, could also be used. In such devices the channel and buffer layers are grown epitaxially, rather than being diffused or implanted. However, the operation is basically the same. Additional information on GaAs based FETs can be found in U.S. Pat. No. 5,477,169, entitled "Logic Circuit With Negative Differential Resistance" and issued Dec. 19, 1995. Additional information on Si based FETs can be found in a copending patent application entitled "Resonant Tunneling Field Effect Transistor" bearing Ser. No. 08/625,667 and filed on Mar. 29, 1996.

In place of an electrode, which would provide external contact to source 18, resonant tunneling device 14 is formed on source 18. Therefore, in this specific example, drain 20, source 18 and gate 22 are current carrying contacts and a control contact respectively, operating as a conventional MOSFET. However, it should be understood that resonant tunneling field-effect transistor 10 is not limited to a specific type of field-effect transistor and any field-effect transistor may be employed, for example heterojunction field-effect transistors, which will become readily apparent with the subsequent embodiments.

Resonant tunneling device 14 is operably positioned on source 18 of field-effect transistor 12 and defines an externally accessible contact. In this specific embodiment, resonant tunneling device 14 is formed of a silicon based material system. Specifically, a conduction layer 30 having a first conductivity is positioned on substrate 16 overlying source 18, a pair of quantum well layers 32 and 34 are positioned on conductive layer 30, separated by a barrier layer 36, and another conduction layer 38 having a second conductivity is positioned on quantum well layer 34 so as to sandwich quantum well layers 32 and 34 and barrier layer 36 between conductive layers 30 and 38.

Conductive layer 38 is heavily doped with a p dopant to form a p++ type conductivity, while conductive layer 30 is heavily doped with an n dopant to form a n++ type dopant. A source electrode 40 is formed on conductive layer 38 to provide an external contact for resonant tunneling device 14 and therefore for field-effect transistor 12. In the specific embodiment illustrated, quantum well layers 32 and 34 are formed of GeSi, and conductive layers 30 and 38 are formed of Si.

Figure 2:
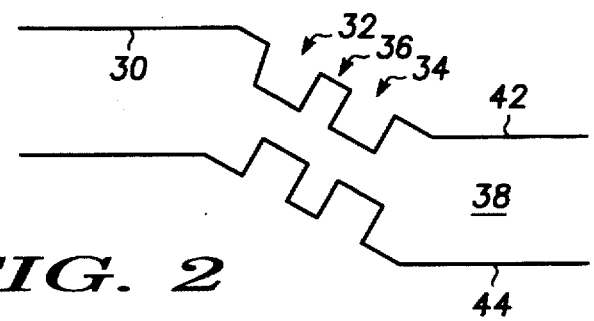
FIG. 2 is an energy diagram for the device of FIG. 1.

Turning now to FIG. 2, an energy band diagram illustrating a conductive band, represented by a line and a valence band, represented by a line 44, of resonant tunneling device 14 is shown. Starting on the left, the band gap of conductive layer 30 is shown with quantum well 32 adjacent thereto. Quantum well 32 is separated from quantum well 34 by barrier layer 36 with conductive layer 38 adjacent to quantum well 34 on the right. As illustrated, resonant tunneling device 14 is biased to shift the energy band downwardly as illustrated in FIG. 2 to allow carrier flow in a manner well known to those skilled in the art.

Figure 3:
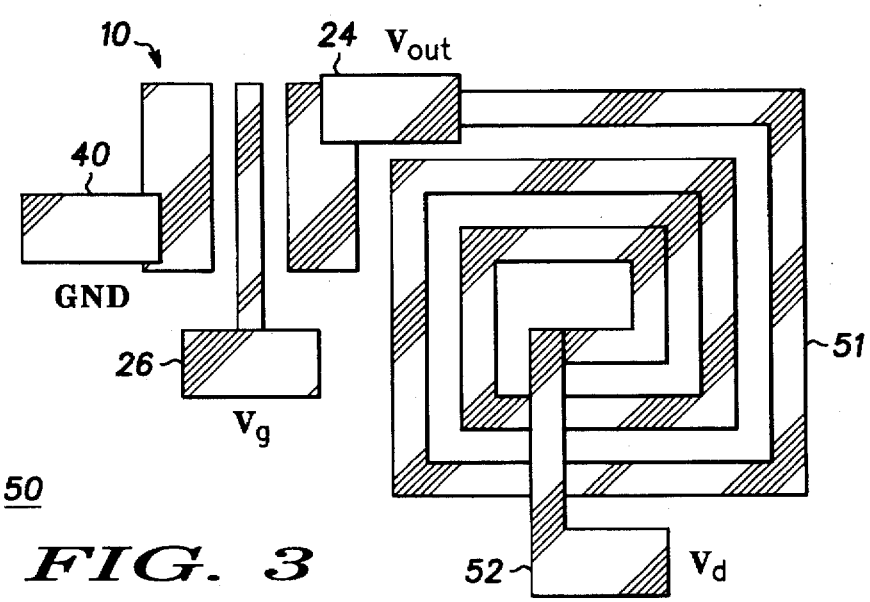
FIG. 3 is a simplified view in top plan of a dual voltage controlled oscillator utilizing the integrated device of FIG. 1, in accordance with the present invention.
Figure 4:
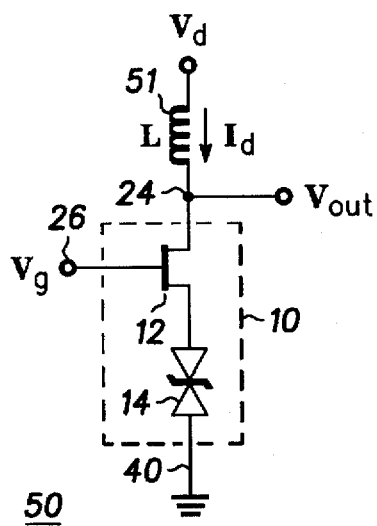
FIG. 4 is a schematic diagram of the dual voltage controlled oscillator of FIG. 3.

Turning now to FIGS. 3 and 4, a top plan view and schematic view are illustrated, respectively, of a dual voltage controlled oscillator 50 utilizing the resonant tunneling field-effect transistor 10 of FIG. 1, in accordance with the present invention. It will of course be understood that device 10 of FIG. 1 is being utilized for example only and many other devices including a field effect transistor with a negative differential resistance diode could be utilized. Dual voltage controlled oscillator 50 includes resonant tunneling field-effect transistor 10 and an inductance 51.

As can be seen most clearly in the schematic diagram of FIG. 4, one terminal of resonant tunneling device 14 is connected to the source of field-effect transistor 12 and the other terminal (contact 40) is grounded or otherwise connected to a common potential. Gate contact 26 of field-effect transistor 12 is externally available for the application of a suitable control voltage. Drain contact 24 of field-effect transistor 12 is connected to inductance 51, which is formed on the substrate of field-effect transistor 12 to completely integrate the circuit. The free end 52 of inductance 51 is externally available for the application of a second suitable control voltage, as will be explained presently.

Figure 5:
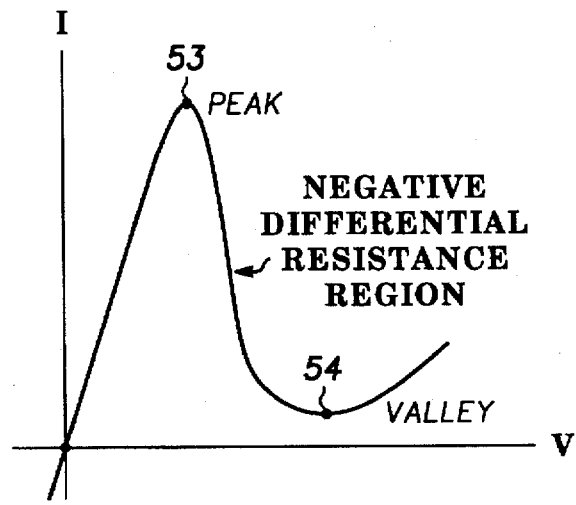
FIG. 5 is a graphical representation of a current-voltage curve of the device of FIG. 1.
Figure 6:
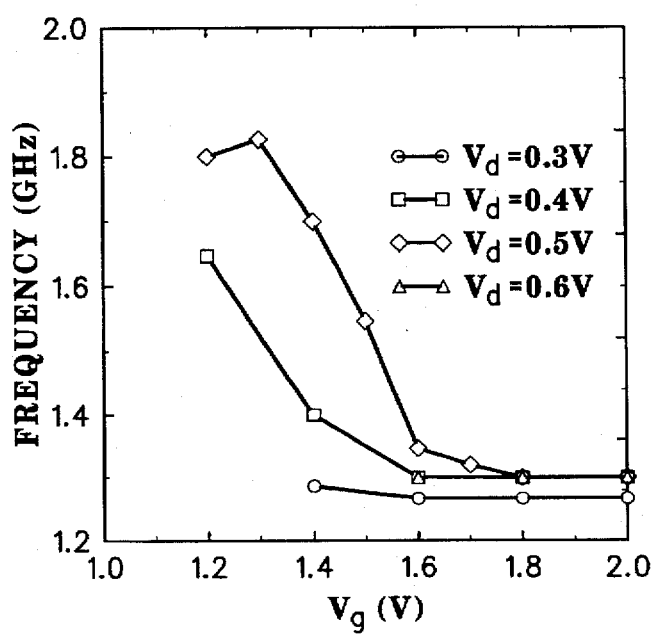

Referring specifically to FIG. 5, a graphical representation of a current-voltage curve of resonant tunneling field-effect transistor 10 of FIG. 1. As can be seen, resonant tunneling device 14, provides transistor 10 with a negative differential resistance region between a peak 53 and a valley 54. By properly selecting the voltage ($V_g$) applied to gate contact 26 and the voltage ($V_d$) applied to free end 52 of inductance 51 dual voltage controlled oscillator 50 is controlled to operate in the negative differential resistance region of resonant tunneling device 14, as can be seen in the graph of FIG. 6. When dual voltage controlled oscillator 50 is operating in the negative differential resistance region of resonant tunneling device 14 oscillation occurs. Further, $V_d$ and $V_g$ can be controlled or adjusted to provide dual voltage control of dual voltage controlled oscillator 50. The graph of FIG. 6 generally illustrates the frequencies of oscillation over which dual voltage controlled oscillator 50 can be adjusted. It will of course be understood that changes of materials and sizes can affect the operating frequencies, so that the graph of FIG. 6 is only intended to be a guide to possible frequencies which can be achieved. Also, it should be understood that the center frequency of this embodiment can be designed by selecting proper values of inductance 51, FET 12 and diode 14 and, with a properly centered operating frequency, the oscillation frequency can be tuned by either of the two voltages ($V_d$ and $V_g$) and up to 40% variation can be achieved.

Figure 7:
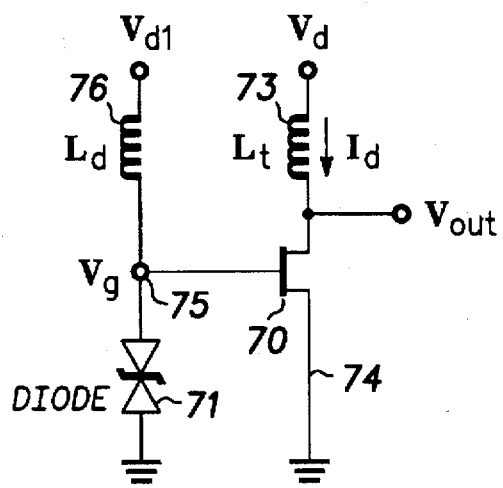
FIG. 7 a schematic diagram of another embodiment of a dual voltage controlled oscillator in accordance with the present invention.
Figure 8:
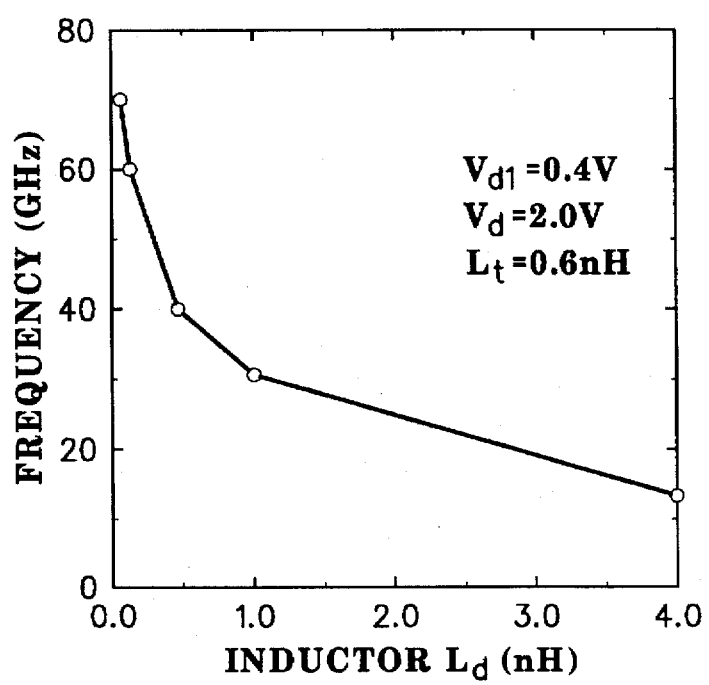
FIG. 8 is a graph illustrating the frequency characteristics of the dual voltage controlled oscillator of FIG. 7.

Turning now to FIG. 7, a second embodiment is illustrated schematically in which a transistor 70 and a diode 71 having a negative differential resistance region of operation are utilized. In this embodiment the drain of transistor 70 is again connected through an inductance 73 to a voltage source $V_d$ (the first controllable voltage). However, in this embodiment a source contact 74 of transistor 70 is connected directly to ground, or other common potential, and diode 71 is connected between a gate contact 75 of transistor 70 and the ground or common potential. Also, a second inductance 76 is connected between gate contact 75 and a source of voltage $V_{d1}$, which serves as the second controllable voltage in this embodiment. This embodiment has a much higher frequency response, as can be seen from the graph in FIG. 8. Again, the center frequency of this embodiment can be designed by selecting proper values of inductances 73 and 76 and transistor 70 and diode 71.

Thus, a novel dual voltage controlled oscillator is disclosed which utilizes a semiconductor device with a negative differential resistance region of operation. The semiconductor device includes a transistor and a diode, such as a resonant tunneling diode, or the like, generally integrated into a single component. The oscillator further includes one or two inductances integrated onto the same substrate as the single integrated component so that the entire oscillator is very small and compact. Further, the novel dual voltage controlled oscillator has very few components (generally 3 or 4) so that it is very inexpensive to manufacture. Also, because the oscillation frequency can be tuned by either or both of two voltages, extra design flexibility is obtained.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A dual voltage controlled oscillator comprising a three terminal transistor with a negative differential resistance diode coupled to a first terminal of the three terminal transistor and an inductance coupled to a second terminal of the three terminal transistor, two of the three terminals of the transistor having applied thereto operating voltages which set the oscillator to operating in a negative differential resistance region of the diode so that oscillations of a selected frequency are produced at an output terminal, and the transistor, the negative differential resistance diode, the inductance and the operating voltages being connected so that varying either of the operating voltages varies the frequency of the oscillations at the output.

2. A dual voltage controlled oscillator as claimed in claim 1 wherein the three terminal transistor and the negative differential resistance diode are integrated into a single heterojunction interband tunneling transistor.

3. A dual voltage controlled oscillator as claimed in claim 1 wherein the three terminals of the transistor are source, drain and gate terminals, and the negative differential resistance diode is connected to the source terminal of the transistor, the inductance is connected to the drain terminal, and the operating voltages are connected to the drain and gate terminals.

4. A dual voltage controlled oscillator as claimed in claim 1 wherein the three terminals of the transistor are source, drain and gate terminals, and the negative differential resistance diode is connected to the gate terminal of the transistor, the inductance is connected to the drain terminal, a second inductance is connected to the gate terminal and the operating voltages are connected to the drain and gate terminals through the inductances, respectively.

5. A dual voltage controlled oscillator comprising a transistor having gate, drain and source terminals, a negative differential resistance diode coupled to the source terminal of the transistor, an inductance coupled to the drain terminal of the transistor, and operating voltages which set the oscillator to operating in a negative differential resistance region of the diode connected to the gate terminal and through the inductances to the drain terminal so that oscillations of a selected frequency are produced at an output terminal, and varying either of the operating voltages varies the frequency of the oscillations at the output.

6. A dual voltage controlled oscillator as claimed in claim 5 wherein the three terminal transistor and the negative differential resistance diode are integrated into a single heterojunction interband tunneling transistor.

7. A dual voltage controlled oscillator comprising a transistor having gate, drain and source terminals, a negative differential resistance diode coupled to the gate terminal of the transistor, a first inductance coupled to the gate terminal of the transistor, a second inductance coupled to the drain terminal of the transistor, and operating voltages which set the oscillator to operating in a negative differential resistance region of the diode connected through the first and second inductances to the gate and drain terminals respectively so that oscillations of a selected frequency are produced at an output terminal, and varying either of the operating voltages varies the frequency of the oscillations at the output.

8. A dual voltage controlled oscillator as claimed in claim 7 wherein the three terminal transistor and the negative differential resistance diode are integrated into a single heterojunction interband tunneling transistor.

9. A method of operating a dual voltage controlled oscillator comprising the steps of:

providing a three terminal transistor with a negative differential resistance diode coupled to a first terminal of the three terminal transistor and an inductance coupled to a second terminal of the three terminal transistor;

coupling operating voltages to the transistor which set the oscillator to operating in a negative differential resistance region of the diode so that oscillations of a selected frequency are produced at an output terminal; and varying either of the operating voltages to vary the frequency of the oscillations at the output.

10. A method of operating a dual voltage controlled oscillator as claimed in claim 9 wherein the step of providing the three terminal transistor with the negative differential resistance diode includes integrating the three terminal transistor and the negative differential resistance diode into a single heterojunction interband tunneling transistor.

11. A method of operating a dual voltage controlled oscillator as claimed in claim 9 wherein the step of providing the three terminal transistor includes providing gate, drain, and source terminals and the step of coupling operating voltages to the transistor includes coupling operating voltages to the gate and drain terminals.

12. A method of operating a dual voltage controlled oscillator as claimed in claim 11 wherein the step of varying either of the operating voltages includes varying both of the operating voltages.

13. A method of operating a dual voltage controlled oscillator as claimed in claim 9 wherein the step of providing a three terminal transistor with a negative differential resistance diode includes providing the transistor with source, drain and gate terminals, connecting the negative differential resistance diode to the source terminal of the transistor, connecting the inductance to the drain terminal, and coupling the operating voltages to the drain and gate terminals.

14. A method of operating a dual voltage controlled oscillator as claimed in claim 9 wherein the step of providing a three terminal transistor with a negative differential resistance diode includes providing the transistor with source, drain and gate terminals, connecting the negative differential resistance diode to the gate terminal of the transistor, connecting the inductance to the drain terminal, connecting a second inductance to the gate terminal, and coupling the operating voltages to the drain and gate terminals through the inductances, respectively.

* * * * *